(12) United States Patent
Guan et al.

(10) Patent No.: US 9,577,072 B2
(45) Date of Patent: *Feb. 21, 2017

(54) TERMINATION DESIGN FOR HIGH VOLTAGE DEVICE

(71) Applicant: Alpha and Omega Semiconductor Incorporated, Sunnyvale, CA (US)

(72) Inventors: Lingpeng Guan, San Jose, CA (US); Anup Bhalla, Santa Clara, CA (US); Hamza Yilmaz, Saratoga, CA (US)

(73) Assignee: ALPHA AND OMEGA SEMICONDUCTOR INCORPORATED, Sunnyvale, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/738,567

(22) Filed: Jun. 12, 2015

(65) Prior Publication Data

US 2015/0279984 A1  Oct. 1, 2015

Related U.S. Application Data

(60) Continuation of application No. 14/206,480, filed on Mar. 12, 2014, now Pat. No. 9,064,897, which is a
(Continued)

(51) Int. Cl.
*H01L 29/76* (2006.01)
*H01L 29/94* (2006.01)
(Continued)

(52) U.S. Cl.
CPC .... *H01L 29/66712* (2013.01); *H01L 29/0619* (2013.01); *H01L 29/0623* (2013.01);
(Continued)

(58) Field of Classification Search
CPC ............... H01L 29/7811; H01L 29/407; H01L 29/0623; H01L 29/404
(Continued)

(56) References Cited

U.S. PATENT DOCUMENTS 3,391,287 A   7/1968   Kao et al.
4,158,206 A   6/1979   Neilson
(Continued)

FOREIGN PATENT DOCUMENTS

CN   202839620 U   3/2013
TW   201130114 A   9/2011

OTHER PUBLICATIONS

Baliga, B.J. Advanced Power MOSFET Concepts. New York: Springer-Science, 2010. 23-61. Print.
(Continued)

*Primary Examiner* — Theresa T Doan
(74) *Attorney, Agent, or Firm* — Joshua D. Isenberg; JDI Patent

(57) ABSTRACT

The present disclosure describes a termination structure for a high voltage semiconductor transistor device. The termination structure is composed of at least two termination zones and an electrical disconnection between the body layer and the edge of the device. A first zone is configured to spread the electric field within the device. A second zone is configured to smoothly bring the electric field back up to the top surface of the device. The electrical disconnection prevents the device from short circuiting the edge of the device. It is emphasized that this abstract is provided to comply with the rules requiring an abstract that will allow a searcher or other reader to quickly ascertain the subject matter of the technical disclosure. It is submitted with the understanding that it will not be used to interpret or limit the scope or meaning of the claims.

7 Claims, 9 Drawing Sheets

Related U.S. Application Data division of application No. 13/561,300, filed on Jul. 30, 2012, now Pat. No. 8,680,613.

(51) Int. Cl.

| | |
|---|---|
| *H01L 29/66* | (2006.01) |
| *H01L 29/40* | (2006.01) |
| *H01L 29/78* | (2006.01) |
| *H01L 29/06* | (2006.01) |
| *H01L 29/08* | (2006.01) |
| *H01L 29/10* | (2006.01) |

(52) U.S. Cl.
CPC ...... *H01L 29/0696* (2013.01); *H01L 29/0878* (2013.01); *H01L 29/1095* (2013.01); *H01L 29/404* (2013.01); *H01L 29/407* (2013.01); *H01L 29/7811* (2013.01); *H01L 2924/0002* (2013.01)

(58) Field of Classification Search
USPC .......................... 257/333, 330–331; 438/271
See application file for complete search history.

(56) References Cited

U.S. PATENT DOCUMENTS

| | | | |
|---|---|---|---|
| 4,573,066 A | 2/1986 | Whight | |
| 4,648,174 A | 3/1987 | Temple et al. | |
| 4,941,026 A | 7/1990 | Temple | |
| 5,637,898 A | 6/1997 | Baliga | |
| 5,973,360 A | 10/1999 | Tihanyi | |
| 5,998,833 A | 12/1999 | Baliga | |
| 6,252,288 B1 | 6/2001 | Chang | |
| 6,452,230 B1 | 9/2002 | Boden, Jr. | |
| 6,512,268 B1 | 1/2003 | Ueno | |
| 6,545,316 B1 | 4/2003 | Baliga | |
| 6,762,455 B2 | 7/2004 | Oppermann et al. | |
| 6,803,626 B2 | 10/2004 | Sapp et al. | |
| 7,087,958 B2 | 8/2006 | Chuang et al. | |
| 7,291,894 B2 | 11/2007 | Sapp et al. | |
| 7,335,944 B2 | 2/2008 | Banerjee et al. | |
| 7,335,949 B2 | 2/2008 | Ninomiya et al. | |
| 7,393,749 B2 | 7/2008 | Yilmaz et al. | |
| 7,649,223 B2 | 1/2010 | Kawashima | |
| 8,076,718 B2 | 12/2011 | Takaya et al. | |
| 8,476,698 B2 | 7/2013 | Guan et al. | |
| 8,575,685 B2 | 11/2013 | Bobde et al. | |
| 8,680,613 B2 * | 3/2014 | Guan .................. | H01L 29/407 257/330 |
| 8,785,279 B2 | 7/2014 | Bhalla et al. | |
| 9,064,897 B2 | 6/2015 | Guan et al. | |
| 9,129,822 B2 | 9/2015 | Bhalla et al. | |
| 9,224,852 B2 | 12/2015 | Guan et al. | |
| 2005/0098826 A1 | 5/2005 | Yamaguchi et al. | |
| 2005/0230744 A1 * | 10/2005 | Wu .................. | H01L 29/0623 257/330 |
| 2006/0249785 A1 | 11/2006 | Bhalla et al. | |
| 2007/0001194 A1 | 1/2007 | Ono et al. | |
| 2007/0001230 A1 | 1/2007 | Lee et al. | |
| 2007/0181927 A1 | 8/2007 | Yedinak et al. | |
| 2011/0076815 A1 | 3/2011 | Bhalla et al. | |
| 2011/0089492 A1 | 4/2011 | Yilmaz | |
| 2011/0101446 A1 | 5/2011 | Guan et al. | |
| 2011/0147830 A1 | 6/2011 | Chen et al. | |
| 2011/0204442 A1 | 8/2011 | Guan et al. | |
| 2011/0220998 A1 | 9/2011 | Darwish et al. | |
| 2011/0227207 A1 | 9/2011 | Yilmaz et al. | |
| 2011/0278650 A1 | 11/2011 | Tamaki et al. | |
| 2012/0161274 A1 | 6/2012 | Lee et al. | |
| 2012/0205737 A1 | 8/2012 | Chen et al. | |
| 2012/0248566 A1 | 10/2012 | Bobde et al. | |
| 2012/0286356 A1 | 11/2012 | Bhalla | |
| 2013/0049102 A1 | 2/2013 | Bobde et al. | |
| 2013/0075808 A1 | 3/2013 | Calafut et al. | |
| 2013/0075809 A1 | 3/2013 | Hsieh | |
| 2013/0092976 A1 | 4/2013 | Hsieh | |
| 2014/0027819 A1 | 1/2014 | Guan et al. | |
| 2014/0027840 A1 | 1/2014 | Guan et al. | |
| 2014/0027841 A1 | 1/2014 | Bhalla et al. | |
| 2014/0035116 A1 | 2/2014 | Xue et al. | |
| 2014/0042490 A1 | 2/2014 | Yilmaz et al. | |
| 2014/0054758 A1 | 2/2014 | Yilmaz et al. | |
| 2014/0073098 A1 | 3/2014 | Calafut et al. | |
| 2014/0091386 A1 | 4/2014 | Chen et al. | |
| 2014/0193958 A1 | 7/2014 | Guan et al. | |
| 2014/0239382 A1 | 8/2014 | Bobde et al. | |
| 2014/0239388 A1 | 8/2014 | Lee et al. | |
| 2014/0242756 A1 | 8/2014 | Xue et al. | |
| 2014/0299914 A1 | 10/2014 | Yilmaz et al. | |
| 2015/0021682 A1 | 1/2015 | Bobde et al. | |
| 2015/0311295 A1 | 10/2015 | Lee et al. | |
| 2015/0349101 A1 | 12/2015 | Bobde et al. | |
| 2015/0357267 A1 | 12/2015 | Ho et al. | |
| 2016/0056096 A1 | 2/2016 | Xue et al. | |

OTHER PUBLICATIONS

Onishi, Y.; Iwamoto, S.; Sato, T.; Nagaoka, T.; Ueno, K.; Fujihira, T., "24 mΩcm2 680 V silicon superjunction MOSFET," Power Semiconductor Devices and ICs, 2002. Proceedings of the 14th International Symposium on , vol., No., pp. 241,244, 2002.

Non-Final Office Action for U.S. Appl. No. 13/561,500, dated Oct. 21, 2014.

Non-Final Office Action for U.S. Appl. No. 13/561,500, dated Feb. 11, 2015.

U.S. Appl. No. 14/841,491, to Anup Bhalla, et al., filed Aug. 31, 2015.

Final Office Action for U.S. Appl. No. 13/561,500, dated Jun. 3, 2015.

Taiwanese Action for TW Application No. 10420360220, dated Mar. 23, 2015.

Non-Final Office Action for U.S. Appl. No. 14/841,491, dated Dec. 4, 2015.

Non-Final Office Action for U.S. Appl. No. 14/980,770, dated Mar. 9, 2016.

Notice of Allowance for U.S. Appl. No. 14/841,491, dated May 4, 2016.

Final Office Action for U.S. Appl. No. 14/980,770, dated Jul. 13, 2016.

Notice of Allowance for U.S. Appl. No. 14/980,770, dated Sep. 22, 2016.

* cited by examiner

TERMINATION DESIGN FOR HIGH VOLTAGE DEVICE

CLAIM OF PRIORITY

This application is a continuation of commonly-assigned, application Ser. No. 14/206,480, filed Mar. 12, 2014, which is a divisional of commonly-assigned, application Ser. No. 13/561,300, filed Jul. 30, 2012, now U.S. Pat. No. 8,680,613, the entire disclosures of which are incorporated herein by reference.

CROSS-REFERENCE TO RELATED APPLICATION

This application is related to commonly-assigned, co-pending application Ser. No. 13/199,381, filed Oct. 25, 2011, the entire disclosures of which are incorporated herein by reference.

This application is related to commonly-assigned, co-pending application Ser. No. 13/561,500, entitled "CORNER LAYOUT FOR HIGH VOLTAGE SEMICONDUCTOR DEVICE" to Lingpeng Guan et al., the entire disclosures of which are incorporated herein by reference.

This application is related to commonly-assigned, co-pending application Ser. No. 13/561,523, entitled "HIGH VOLTAGE FIELD BALANCE METAL OXIDE FIELD EFFECT TRANSISTOR" to Anup Bhalla et al., filed Jul. 30, 2012, the entire disclosures of which are incorporated herein by reference.

FIELD OF THE INVENTION

Embodiments of the present invention are related to semiconductor power devices. More particularly, this invention relates to new configurations and methods for manufacturing a termination structure for field balance metal oxide field effect transistors (FBMs).

BACKGROUND OF THE INVENTION

Conventional technologies to configure and manufacture high voltage semiconductor power devices are still confronted with difficulties and limitations to further improve the performance due to different tradeoffs. In vertical semiconductor power devices, there is a tradeoff between the drain to source resistance, i.e., on-state resistance, commonly represented by $R_{ao}$, (i.e., drain-source resistance X Active Area) as a performance characteristic, and the breakdown voltage sustainable by the power device. A commonly recognized relationship between the breakdown voltage (BV) and the $R_{dsA}$ is expressed as: $R_{dsA}$ is directly proportional to $BV^{2.5}$. For the purpose of reducing the $R_{dsA}$, an epitaxial layer is formed with a higher dopant concentration. However, a heavily doped epitaxial layer also reduces the breakdown voltage sustainable by the semiconductor power device.

It is within this context that embodiments of the present invention arise.

BRIEF DESCRIPTION OF THE DRAWINGS

The teachings of the present invention can be readily understood by considering the following detailed description in conjunction with the accompanying drawings, in which.

DESCRIPTION OF THE SPECIFIC EMBODIMENTS

Although the following detailed description contains many specific details for the purposes of illustration, anyone of ordinary skill in the art will appreciate that many variations and alterations to the following details are within the scope of the invention. Accordingly, the exemplary embodiments of the invention described below are set forth without any loss of generality to, and without imposing limitations upon, the claimed invention. In the following discussion, an N-type device is described for purposes of illustration. P-type devices may be fabricated using a similar process but with opposite conductivity types.

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

INTRODUCTION

Figure 1:
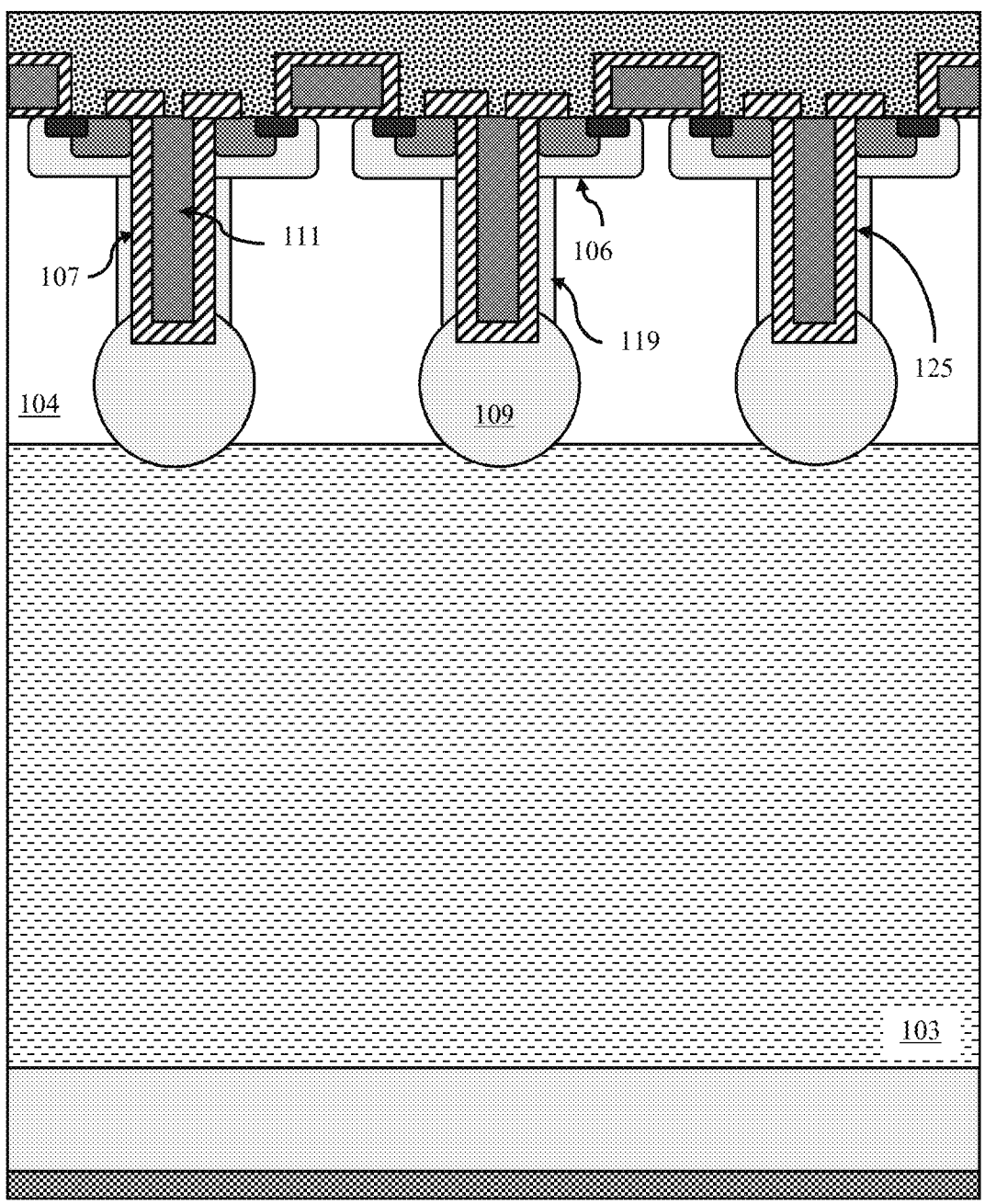
FIG. 1 is a diagram of a Field Balance MOSFET (FBM) device.

The unique design of a field balance metal oxide field effect transistor (FBM) has been shown to significantly increase the BV of a device while only increasing $R_{dsA}$ minimally. FIG. 1 provides the basic structure of an FBM device 100. In an FBM device the BV is split between a surface shielded region 104 and a voltage blocking region 103. By way of example and not by way of limitation, an FBM device designed to have a BV of 660 V may have the surface shielded region 104 support 140 V and the voltage blocking region 103 may support 520 V. The voltage blocking region 103 functions as a traditional epitaxial (epi-) layer and follows the relationship of $R_{dsA}$ a $BV^{2.5}$. Therefore, the proportional decrease in $R_{dsA}$ of the device as a result of decreasing the voltage supported by the voltage blocking region 103 from 660 V to 520 V is: $(660/520)^{2.5}=1.81$. For example, if the $R_{dsA}$ of a device was originally 82 mΩ·cm² for an epi-layer that must support the entire 660 V, then for a voltage blocking region 103 that only needs to support 520 V, the reduced $R_{dsA}$ would be only 45.2 mΩ·cm².

The surface shielded region 104 is configured to support the remaining voltage, while only adding a negligible amount of resistance. In order to accomplish this, the surface shielded region 104 is highly doped in order to minimize $R_{dsA}$. However, with a high doping concentration, the epi-layer alone cannot support enough voltage. Therefore, the surface shielded region 104 needs to be charge compensated. The charge compensation is provided by two separate components: (1) a MOS capacitor created by the oxide 107 surrounding the shield electrode 111; and (2) the buried P-region 109. Both components can be configured such that they each support the desired amount of the voltage. By way of example and not by way of limitation, the voltage supported by the surface shielded region 104 may be half supported by the buried P-region 109 and half supported by the oxide 107. FBM devices are described in greater detail in the commonly assigned patent application Ser. No. 13/561,523, which was incorporated herein by reference above.

The use of an FBM device allows for a higher breakdown voltage BV for a given $R_{dsA}$ than a conventional MOSFET device, but the FBM structure itself does not prevent the reduction of BV at localized spots. Specifically, the BV at the edge of a device die is typically much lower than the BV that can be supported by the drift layer. Termination structures are used in order to minimize the peak electric field at the edges of the device in order to decrease the effects of localized breakdown.

Figure 2A:
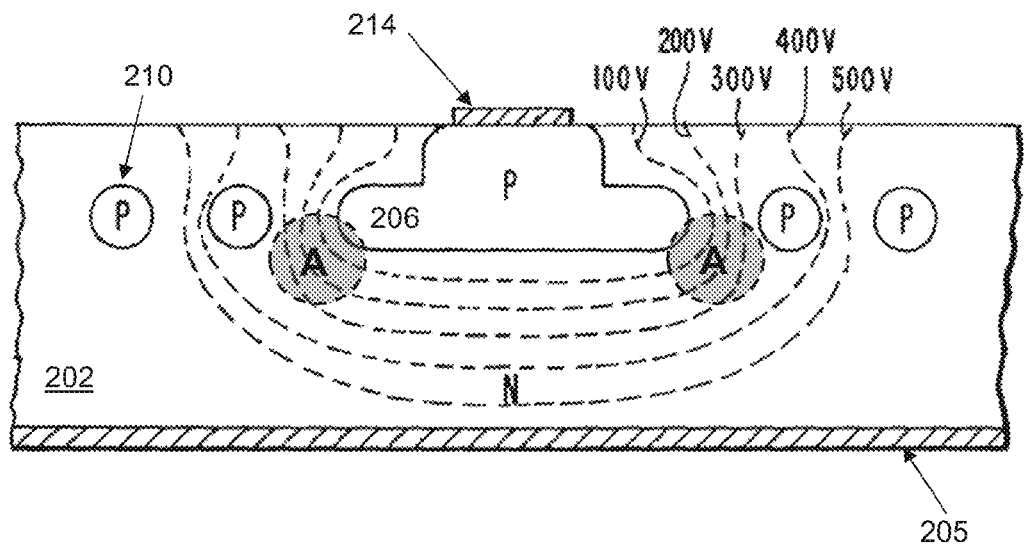
FIG. 2A is a diagram of a prior art buried guard ring termination structure.

One such termination structure is a buried guard ring. FIG. 2A depicts the basic structure of a buried guard ring in the context of a P-N junction device 200. The junction is formed by an N-doped semiconductor substrate 202 being in contact with a P-doped region 206. The P-doped region 206 is connected to a source electrode 214 and the semiconductor substrate 202 is in electrical contact with the drain electrode 205. The addition of the P-doped guard rings 210 alleviates the electric field crowding at the P-N junction in the region labeled A.

The guard ring structure serves to reduce the amount of field crowding at the main P-N junction by spreading the depletion layer past consecutively higher potential floating junctions (rings). Each guard ring 210 becomes biased when the spreading depletion layer punches through to the floating junction. To remain in equilibrium, the ring's potential will follow that of the surrounding material to within the built-in potential of the junction.

Careful spacing is required to achieve the desired reduction in the electric field. If the guard rings 210 are spaced too close to the P-N junction then the most of the potential will be transferred to the rings and the break down will occur at the guard ring's 210 junction with the substrate. If the guard rings 210 are spaced too far away from the P-N junction, then not enough potential will be transferred to the rings and the breakdown will occur at the P-N junction. The guard rings 210 are buried within the substrate to ensure that the improvement in breakdown BV is not surface limited by excess surface charge. However, additional mask and epitaxial layer growth are needed in order to manufacture a buried guard ring structure.

Figure 2B:
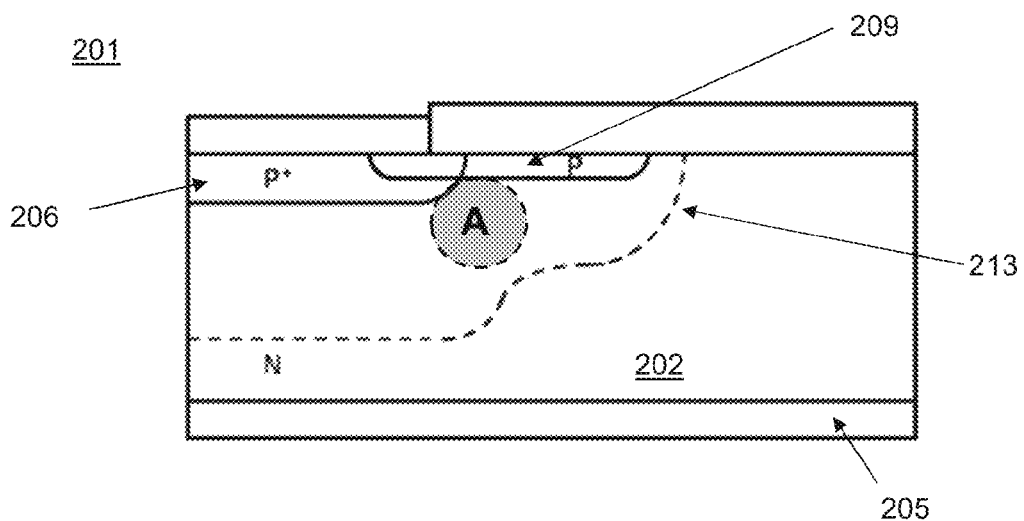
FIG. 2B is a diagram of a prior art junction termination extension termination structure.

The use of a junction termination extension (JTE) is an alternative method to relieve electric field crowding at the P-N junction in the region labeled A as shown in FIG. 2B. In a JTE the surface electric field at the edges of the device are altered by selectively adding charge to the junction. FIG. 2B depicts the basic structure of a device 201 that uses a prior-art JTE. The P-N junction is formed by an N-doped semiconductor substrate 202 being in contact with a P-doped region 206. The additional charge is added in the JTE region 209. The effectiveness of the JTE region 209 is determined by the amount of charge added (i.e., the doping concentration). If the concentration is too high, then the JTE will serve only to extend the P-N junction and the breakdown will occur at the far right end of the JTE region 209 without an increase in the BV. Alternatively, if the concentration of the JTE region 209 is too low, then there will be no beneficial effect and the breakdown will occur at the end of the P-doped region 206 with no increase in the BV. In order to reduce the electric field at the original P-N junction, the JTE region 209 must be designed such that the charge is completely depleted by the reverse bias. In FIG. 2B the depletion area is represented by dotted line 213. When JTE region 209 is completely depleted, the electric field will be spread out over the entire length of the JTE region 209 instead of being crowded at the original P-N junction.

However, JTE structures are susceptible to surface mobile ionic charges. This issue reduces the effectiveness of the termination structure and leads to problems with achieving good reproducibility.

Termination Structure

Certain embodiments of the present invention are directed to a termination structure for a semiconductor transistor device. The termination structure is composed of three unique zones. The first zone is configured to spread the electric field within the device. The second zone is configured to smoothly bring the electric field back up to the top surface of the device. The third zone is configured to prevent the body layer from shorting to the edge of the device die. It is noted that in some embodiments, the functions of two or more of these zones may be combined into a feature that can be implemented structurally as a single zone.

Each zone includes a first semiconductor layer, e.g., a semiconductor substrate, of a first conductivity type. A second semiconductor layer, e.g., an epitaxial layer, of the first conductivity type is located on top of the substrate. The epitaxial layer is divided into a surface shielded region and a voltage blocking region. The surface shielded region is highly doped and the voltage blocking region is lightly doped with respect to the surface shielded region. The zones each contain one or more structures comprising a deep trench lined with an oxide and filled with a conductive material with a buried doped-region of the second conductivity type at its bottom. Each of the buried-doped regions connect to the body region. As used throughout the rest of this description, the first conductivity type will be N-type and the second conductivity type will be P-type. One skilled in the art will recognize that the doping types may be reversed in accordance without departing from the scope of embodiments of the present invention.

Within the first zone, insulated shield electrodes fill each trench and are electrically connected to a portion of the body layer closer to the active cell array. Within the second zone, insulated shield electrodes fill each trench and are electrically connected to a portion of the body region further away from the active cell array. The spacing between the trenches of the second region increases as the distance from the active cell array increases. This allows for the electric field to be smoothly brought back up to the top surface of the device. Within the third zone, the device structures have floating field plates that interrupt the body region in order to create a channel stop.

A second embodiment of the present invention is directed to a termination structure for a FBM device which requires only two zones. The first zone is configured to spread the electric field within the device. The second zone is configured to smoothly bring the electric field back up to the top surface of the device. According to this embodiment a third zone is not required because a disconnect between the buried P-region and the body region is incorporated into one of the processing steps required for the fabrication of the FBM device.

According to the second embodiment, both zones include a first semiconductor layer, e.g., a semiconductor substrate, of a first conductivity type. A second semiconductor layer, e.g., an epitaxial layer, of the first conductivity type is located on top of the substrate. The epitaxial layer is divided into a surface shielded region and a voltage blocking region. The surface shielded region is highly doped and the voltage blocking region is lightly doped with respect to the surface shielded region. The zones each contain one or more structures each of which has a deep trench with a buried doped-region of the second conductivity type at its bottom. According to this embodiment, the buried-doped regions are prevented from connecting to the body region.

Within the first zone, insulated shield electrodes fill each trench and are electrically connected to a portion of the body layer closer to the active cell array. Within the second zone, insulated shield electrodes fill each trench and are electrically connected to a portion of the body region further away from the active cell array. The spacing between the trenches of the second region increases as the distance from the active cell array increases. This allows for the electric field to be smoothly brought back up to the top surface of the device. In order to prevent a short circuit from forming between the body layer and the edge of the device die, an extra masking step is implemented during the fabrication of the FBM device. The mask is used to create an electrical disconnect between the buried P-regions and the body region. This prevents the device from shorting to the edge of the device die and therefore, the third zone (the channel stop) is no longer required. Though an additional process step is included, the benefit is that space saved by removing the third termination zone can be used for more active cells.

Specific Embodiments

A first embodiment of the present invention is directed towards a termination structure for a semiconductor transistor device that utilizes buried P-regions which are each connected to the body region. Due to the connection between the buried P-regions and the body region, a three zone termination structure is required.

Figure 3A:
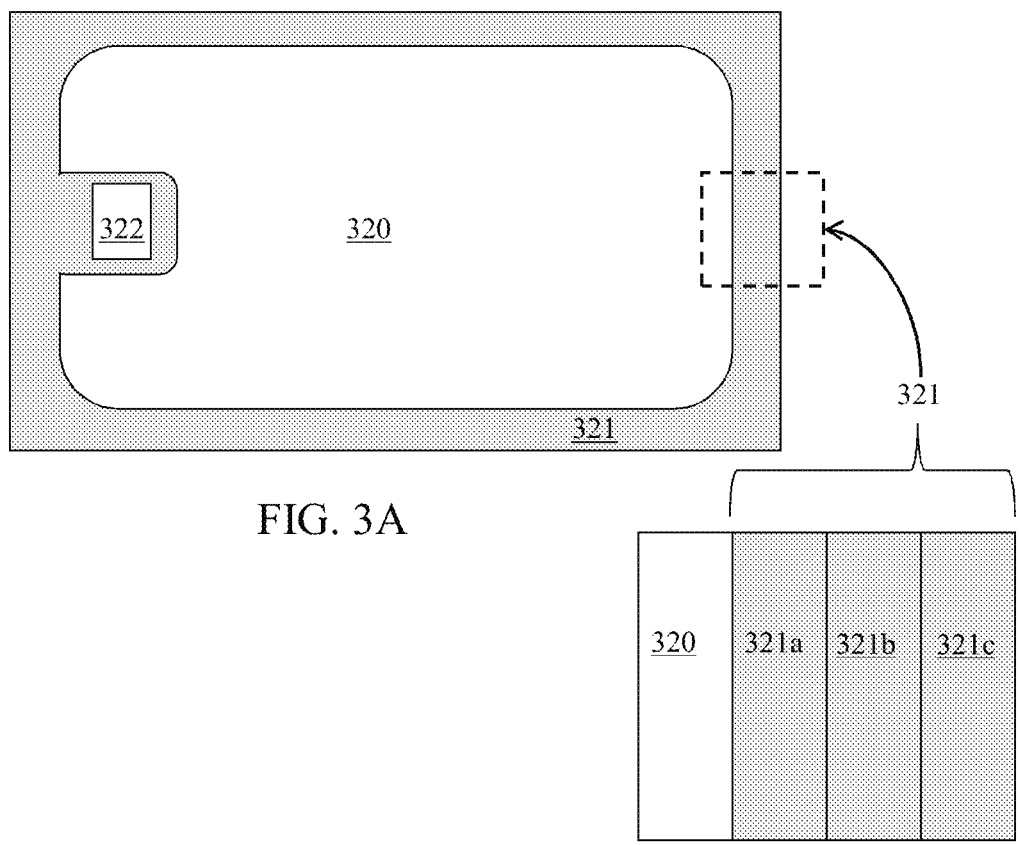
FIG. 3A is a top view of a device die showing the active area and the termination region according to a first embodiment of the present invention.

FIG. 3A is a top view of a device die according to a first embodiment of the present invention. It depicts a gate pad 322, and a termination region 321 formed around an active cell array 320. The active cell array 320 contains a plurality of active semiconductor transistor devices. By way of example and not by way of limitation, the active devices may be an FBM device depicted in FIG. 1 and described in commonly owned patent application Ser. No. 13/561,523, which was incorporated herein by reference above. The termination region 321 is comprised of three unique zones. The region surrounded by the dotted box is magnified in order to show a clearer view of the termination region 321. The small segment is a representation of the entire outside perimeter of the device die. The first zone 321a is proximate to the active cell array 320 and surrounds the entire perimeter of the active cell array 320. The second zone 321b is formed immediately outside the first zone and surrounds the entire outer perimeter of the first zone 321a. The third zone 321c is formed immediately outside the second zone and surrounds the entire outer perimeter of the second zone 321b. The third zone 321c extends to the edge of the device die. The width of each zone is provided as one possible configuration. It should be noted that the designer is free to alter the respective widths of each zone to maximize the properties desired for the device.

Active devices designed to withstand high voltage like the FBM device described above are limited by the lower BV present at the edges of the device. As such, properly designing the termination region 321 is critical in order to maximize the BV of the entire device. The three termination zones 321a, 321b, and 321c each have a specific role in maximizing the BV at the edge of the device.

Figure 3B:
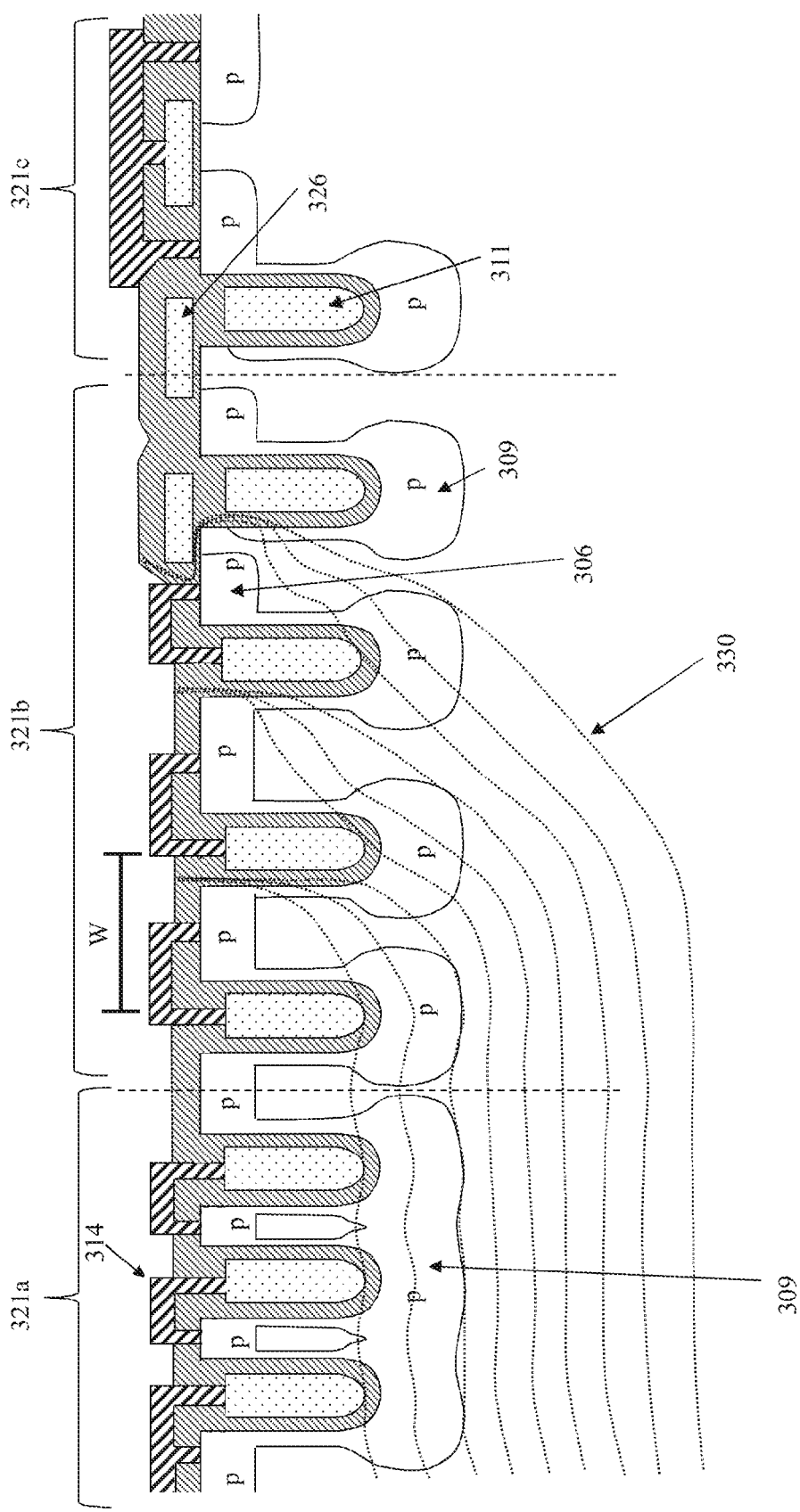
FIG. 3B is a cross section view of the termination region that depicts the electric potential contours of a first embodiment of the present invention.

FIG. 3B demonstrates how each region alters the electric potential contours 330. In the first termination zone 321a the electric potential contours are mostly prevented from coming to the surface. The buried P-region 309 depletes and prevents the potential contours from advancing towards the surface of the device. As discussed above in the background, the electric field is spread over the entire depleted area and as a result the first termination zone 321a is capable of spreading the electric field.

Figure 4A:
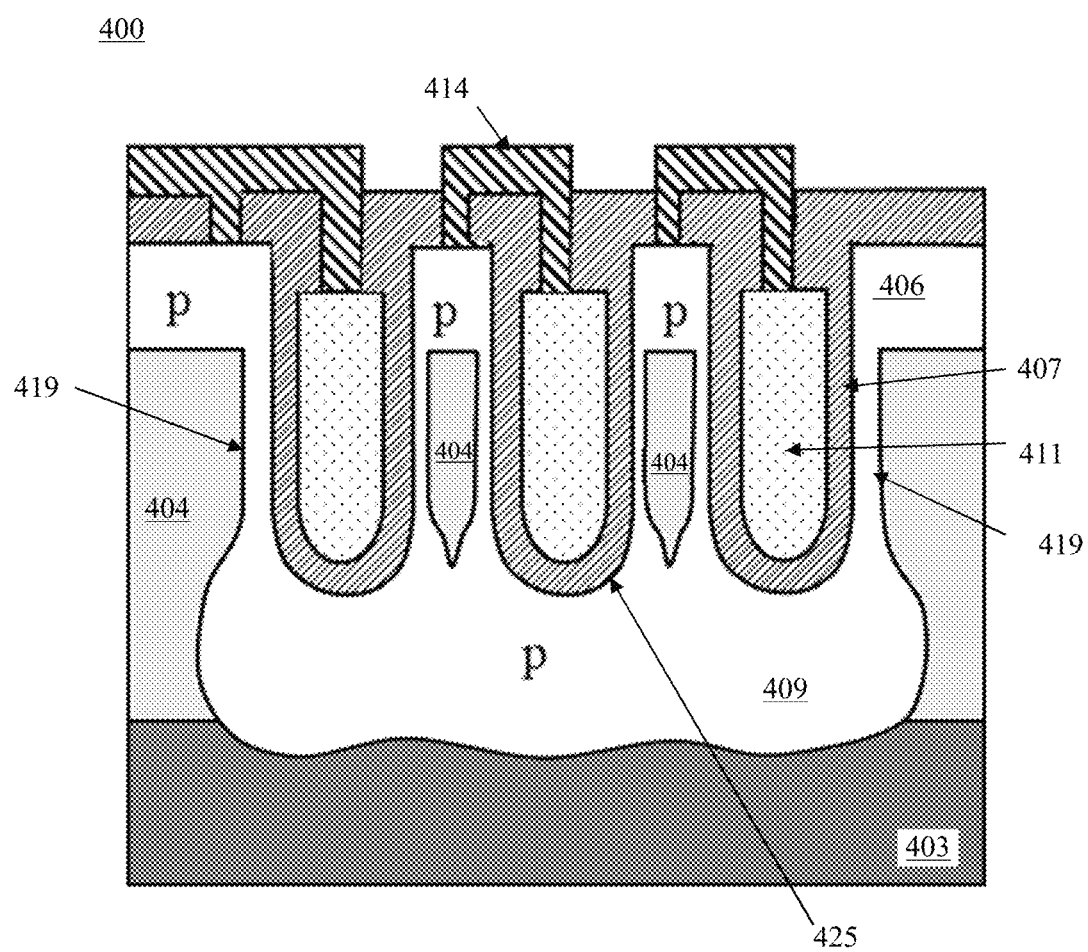
FIGS. 4A-4C are cross sectional views of the three different termination zones within the termination region according to a first embodiment of the present invention.

FIG. 4A is a cross section of the termination structures 400 in the first termination zone 321a. The first termination zone 321a is designed such that near the edge of the active cell region the electric field is spread rapidly. The termination device structures 400 within the first termination zone 321a are formed on a suitably doped (e.g., N-type) semiconductor substrate (not shown). Above the substrate, a voltage blocking region 403 is formed. It should be noted that only the top portion of the voltage blocking region 403 is depicted in FIG. 4A. Above the voltage blocking region 403 is a surface shielded region 404. Both layers are suitably doped (e.g., N-type), but the doping density of the surface shielded layer 404 is on the order of 5-100 times greater. By way of example and not by way of limitation, the voltage blocking region 403 may have a doping concentration of about 1e14 $cm^3$ to 5e15 $cm^3$, and the surface shielded region 404 may have a doping concentration of about 1e15 $cm^3$ to 5e16 $cm^3$. These layers are formed at the same time the corresponding layers in the active cell region are formed and therefore require no additional processing steps.

The termination device structures 400 also include trenches 425 extending down through the surface shielded region 404. However, it should be noted that the depth of the shield trench is variable and can also extend into the voltage blocking region 403 in some embodiments. The trench is lined with a suitable dielectric material 407. By way of example and not by way of limitation the dielectric material may be a thermal oxide or a deposited oxide. The trenches 425 are filled with a conductive material to form a shield electrode 411. By way of example and not by way of limitation, the shield electrode may be formed with polysilicon. The shield trench and electrodes for the termination device structures may be formed during the same processing steps that are used to form the active device shield trenches and shield electrodes and therefore require no additional processing steps. Proximate to the shield electrode 411 at the top surface of the surface shielded region 404 a suitably doped (e.g., P-doped) body layer 406 is formed. The body layer 406 extends from the shield electrode 411 and continues until it reaches the next trench.

In order to quickly spread the electric field, electrical connection 414 connects the shield electrode 411 to a portion of the body layer 406 to its left. As shown in FIG. 4A, the body layer 406 to the left of a shield electrode 411 is closer to the active region. The spreading of the electric field is also achieved through the use of buried P-doped regions 409. Buried P-regions 409 are formed below each shield electrode 411. By way of example and not by way of limitation, the cumulative depth of the trench 425 plus the buried P-region 409 may extend deeper than or substantially the same depth as the surface shielded region 404.

As used herein, the term "substantially the same depth" means that the depth of the surface shielded region 404 is within ±10% of the cumulative depth of the trench 425 plus the buried P-region 409.

Forming the depleting region 409 below the surface of the device 400 provides an advantage over traditional JTE type termination structures. Using a buried P-region 409 will yield a higher overall BV because the BV will not be diminished by externally induced variations across the surface of the device. By way of example and not by way of limitation, the buried P-region 409 may be formed through ion implantation. The P-type dopants are implanted at the bottom of the trench before the dielectric material 407 and shield electrode 411 are formed in the trench. The buried P-regions 409 below each trench may become connected to the adjacent buried P-regions 409. Additionally, the buried P-region 409 nearest the active cell array 320 may be connected to the buried P-region 109 of an active device structure.

In the active cell array 320 the buried P-regions 109 create a P-N junction capacitor when it is not connected to the body layer 106. This creates problems with switching, because the presence of floating P-regions 109 causes higher dynamic on resistance during switching.

Therefore, a P-link 119 between the buried P-region 109 and the upper body region 106 may be formed to create an electrical path for the buried P-regions 109 to discharge. According to one embodiment, the P-links 119 may be created with a blanket tilt implant in order to minimize masking steps. The blanket implant also creates P-links 419 between the buried regions 409 in the termination zones and the body layer 406.

Once the electric field has been spread it must then be brought back to the surface quickly and in a uniform manner. FIG. 3B shows that in the second termination zone 321b the electric field is allowed to move back to the surface by allowing the potential contours 330 to form in between the vertical walls of the shield electrodes 311.

Figure 4B:
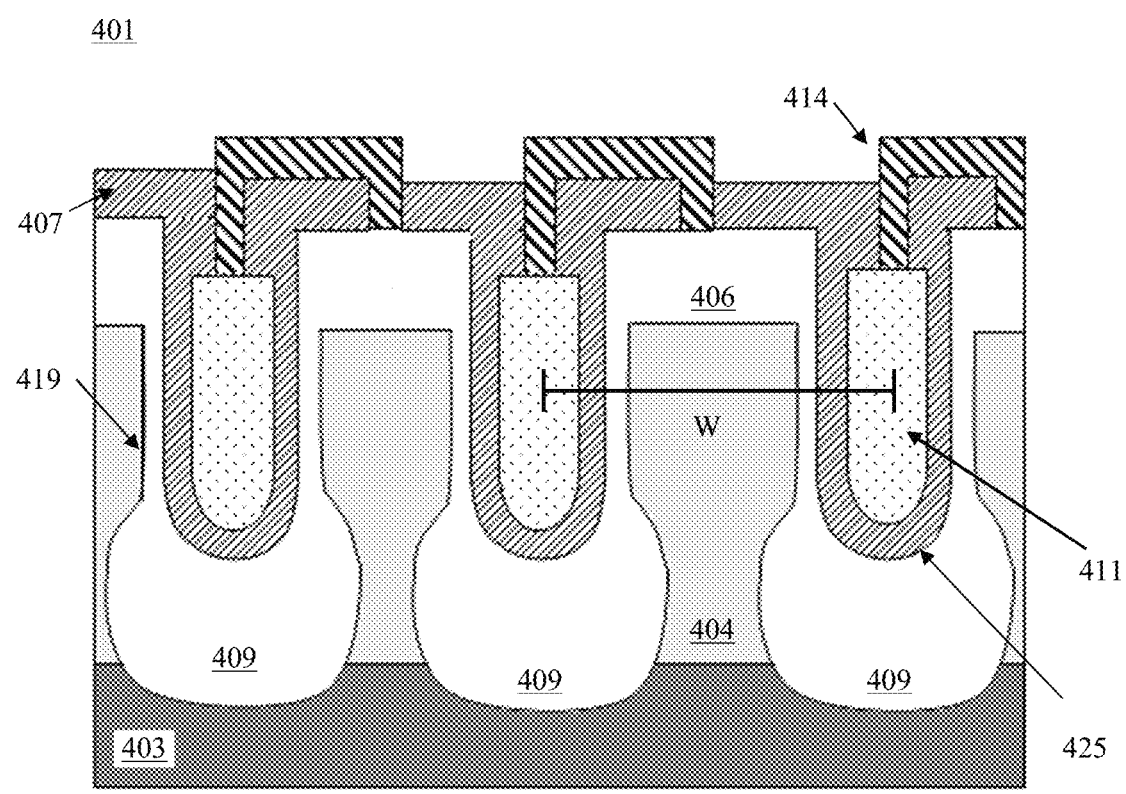

FIG. 4B depicts the termination structures 401 in the second termination zone 321b. These termination structures in the second zone 401 are formed in a similar manner to those in termination zone one. In the present embodiment there are only two differences. First, electrical connector 414 connects the shield electrode 411 to the body layer 406 immediately following the shield electrode 411. As shown in FIG. 4B, the body layer 406 immediately following the shield electrode 411 is the one immediately to the right of the trench and further away from the active area. Second, the spacing between the trenches W increases as the structures' 401 distance from the active cell region increases. Within the second termination zone, the buried P-regions 409 are in electrical connection with the buried P-regions 409 of the first termination zone through their connection to the body layer 406.

Once the electric field is brought to the surface, the third termination zone 321c is needed in order to prevent a short circuit to the edge of the device. As shown in FIG. 3B, surface poly regions 326 serve as a field plate and interrupt the body layer 306. This prevents a short circuit from forming between the body layer and the edge of the device. The surface poly regions 326 are floating and therefore are not connected to the gate potential. As shown, the body layer 306 is no longer connected to adjacent conducting regions in the third termination zone 321c.

Figure 4C:
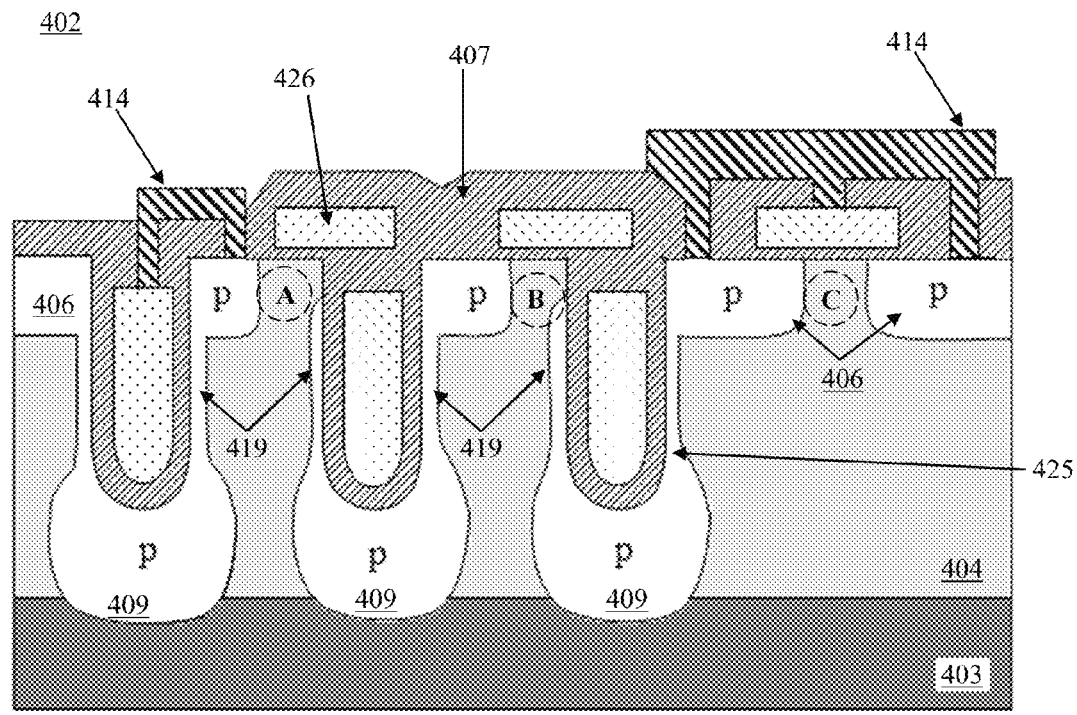

FIG. 4C shows the structure of the third termination zone 321c and illustrates how it acts as a channel stop. The termination structures 402 in the third termination zone 321c are formed in a similar manner to those in the previous termination zones. In the present embodiment the difference in the third termination zone 321c is that floating surface poly regions 426 are formed above the surface shielded region 404. As a result the body region 406 is prevented from forming underneath the surface poly regions 426. This prevents the P-link 419 from creating a connection between the buried P-region 409 and the body region 406.

Additionally, it is hard to invert regions A, B, and C and therefore, a P-channel will not form in response to surface charges. This disconnection between the two regions creates a break in the short circuit that would otherwise continue to the edge of the device die. It should be noted that FIG. 3C depicts three separate surface poly regions 426, but only one field plate is necessary to disrupt the short circuit.

Figure 5A:
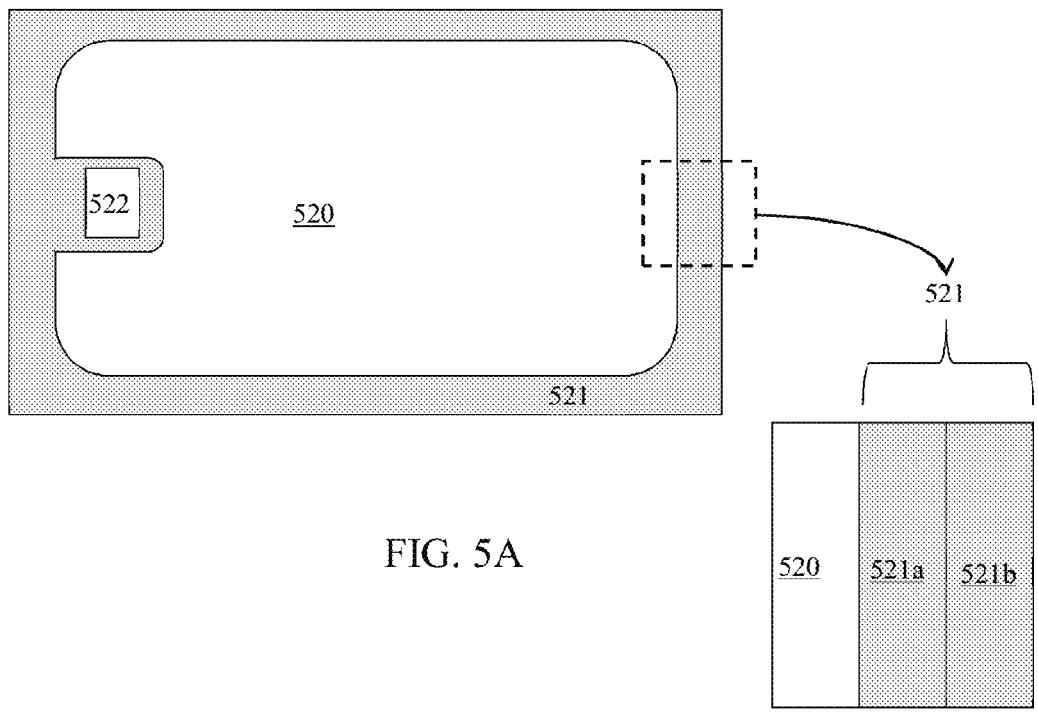
FIG. 5A is a top view of a device die showing the active area and the termination area according to a second embodiment of the present invention.
Figure 5B:
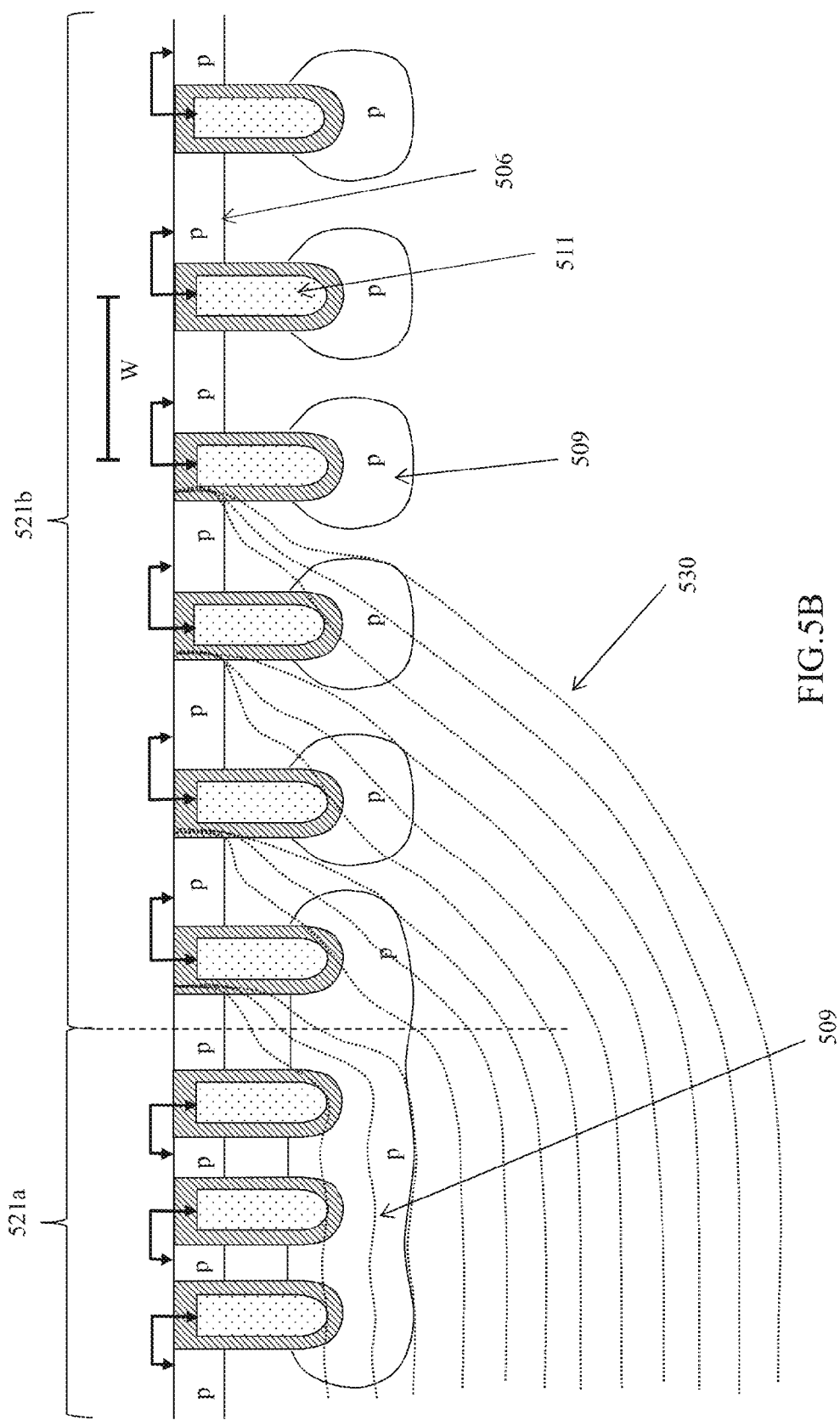
FIG. 5B is a cross section view of the termination region that depicts the electric potential contours of a second embodiment of the present invention.

According to a second embodiment of the present invention depicted in FIG. 5B, only two termination zones are required. By eliminating one of the termination zones, valuable space on the device die can now be used for additional active device structures. The reduction in the number of zones is made possible by the electrical disconnection created between the buried P-regions 509 and the body region 506 as a result of there being no P-links 119 in the termination region 521. When the buried P-regions 509 are connected to the body layer 506 with P-links 119, there is a continuous electrical path. However, without P-links 119 connecting the buried P-regions 509 to the body region 506, the body layer 506 is no longer continuous because the shield electrodes 511 interrupt the body layer. Therefore, according to this embodiment the body layer 506 is unable to create a short circuit to the edge of the device and there is no need for floating field plates or a third termination zone. This is an example of a situation where the functions of the second and third zones are combined into the structure of a single zone.

The second embodiment of the present invention is directed at a termination structure for a semiconductor transistor device in which not every buried P-region 109 is connected to the body region 106 with a P-link 119. An extra mask layer is required in order to create a semiconductor transistor device with P-links 119 at selected locations. The additional mask layer is used instead of using a blanket implant to create the P-links 119. The method of fabricating this type of semiconductor transistor device is described in further detail in commonly owned U.S. patent application Ser. No. 13/561,523, which was incorporated herein by reference above. It is this additional masking step that allows for the second embodiment of the present invention to be used. While masking off locations in the active cell array 520 that will not have P-links 119, the entire termination region 521 can be masked off to prevent P-links 119 from forming a connection between the buried P-region 509 and the body region 506.

FIG. 5A is a top view of a device die according to the second embodiment of the present invention. It depicts the gate pad 522 and a termination region 521 formed around an active cell array 520. The active cell array 520 contains a plurality of active FBM devices. The termination region 521 is comprised of two unique zones. The region surrounded by the dotted box is magnified in order to show a clearer view of the termination region 521. The small segment is a representation of the entire outside perimeter of the device die. The first zone 521a is proximate to the active cell region 520 and surrounds the entire perimeter of the active cell array 520. The second zone 521b is formed immediately outside the first zone 521a and surrounds the entire outer perimeter of the first zone 521a. The second zone 521b extends to the edge of the device die. The widths of each zone shown in FIG. 5A are provided as one possible configuration. It should be noted that the designer is free to alter the respective widths of each zone to maximize the properties desired for the device.

FIG. 5B demonstrates how each region alters the electric potential contours 530. In the first termination zone 521a the electric potential contours are mostly prevented from coming to the surface. The buried P-regions 509 prevent most of the potential contours from advancing towards the surface of the device. As discussed above, the electric field is spread over the entire depleted region formed by the buried P-region 509 and as a result the first termination zone 521a is capable of spreading the electric field. It should be noted that the buried P-region 509 is disconnected from the body region throughout the entire termination zone 521.

Figure 6A:
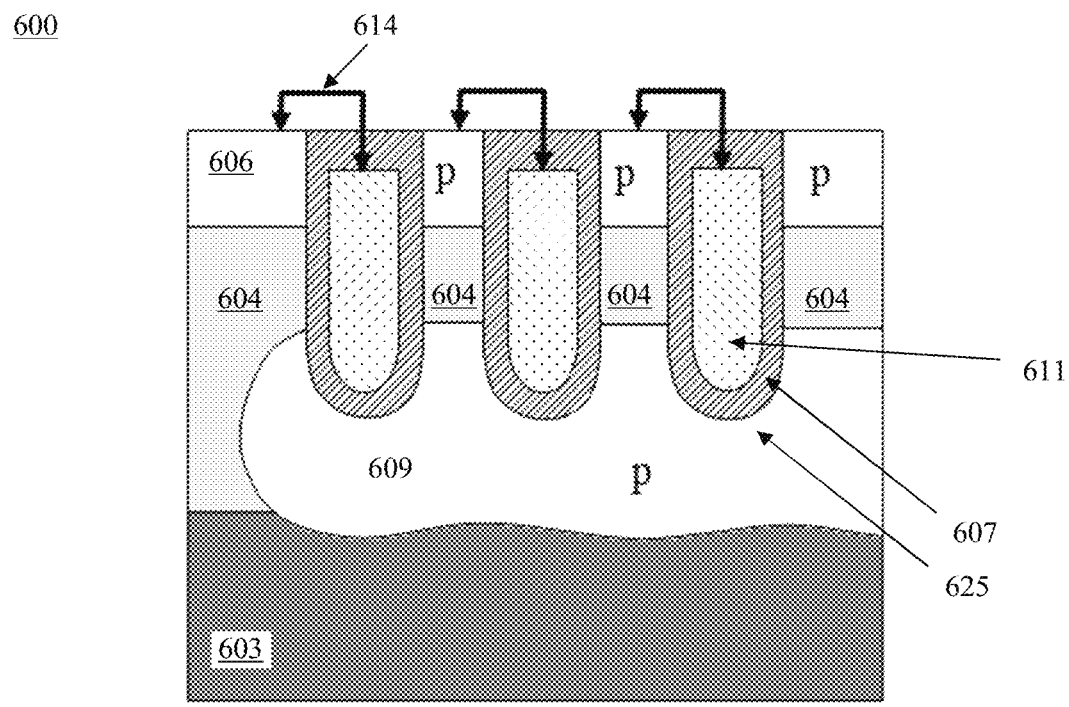
FIGS. 6A-6B are cross sectional views of the two different termination zones within the termination region according to a second embodiment of the present invention.

FIG. 6A is a cross section of the termination structures 600 in the first termination zone 521a. The first termination zone 521a is designed such that near the edge of the active cell array 520 the electric field is spread rapidly. Similar to the active device, the termination device structures 600 within the first termination zone 521a are formed on a suitably doped (e.g., N-type) semiconductor substrate (not shown). Above the substrate, a voltage blocking region 603 is formed. It should be noted that only the top portion of the voltage blocking region 603 is depicted in FIG. 6A. Above the voltage blocking region 603 is a surface shielded region 604. Both layers are suitably doped (e.g., N-type), but the doping density of the surface shielded layer 604 is on the order of 5-100 times greater. By way of example and not by way of limitation, the voltage blocking region 603 may have a doping concentration of about 1e14 $cm^3$ to 5e15 $cm^3$, and the surface shielded region 604 may have a doping concentration of about 1e15 $cm^3$ to 5e16 $cm^3$. These layers are formed at the same time the corresponding layers in the active cell region are formed and therefore require no additional processing steps.

The termination device structures 600 also include trenches 625 extending down through the surface shielded region 604. However, it should be noted that the depth of the shield trench is variable and can also extend into the voltage blocking region 603 in some embodiments. The trench is lined with a suitable dielectric material 607. By way of example and not by way of limitation the dielectric material may be a thermal oxide or a deposited oxide. The trenches 625 are filled with a conductive material to form a shield electrode 611. By way of example and not by way of limitation, the shield electrode may be formed with polysilicon. The shield trench and electrodes for the termination device structures may be formed during the same processing steps that are used to form the active device shield trenches and shield electrodes and therefore require no additional processing steps. Proximate to the shield electrode 611, at the top surface of the surface shielded region 604, a suitably doped (e.g., P-doped) body layer 606 is formed. The body region 606 extends from the shield electrode 611 and continues until it reaches the next trench.

In order to quickly spread the electric field, an electrical connection 614 connects the shield electrode 611 to a portion of the body region 606 to its left. As shown in FIG. 6A, the body region 606 to the left of a shield electrode 611 is closer to the active region. By way of example and not by way of limitation, the connection between the shield electrode 611 and the body region 606 may be made with a conductive material such as aluminum. The spreading of the electric field is also achieved through the use of buried P-doped regions 609. Buried P-regions 609 are formed below each shield electrode 611. By way of example and not by way of limitation, the cumulative depth of the trench 625 plus the buried P-region 609 may extend deeper than or substantially the same depth surface shielded region 604. In the context of the type of device shown in FIGS. 6A-6B, the term "substantially the same depth" includes a depth that is within ±10% of the thickness of the surface shielded region. Forming the buried P-region 609 below the surface of the device provides an advantage over traditional JTE type termination structures. Without surface interactions, the buried P-region 609 will yield a higher overall BV, and the BV will not be diminished by surface charge variations across the device.

By way of example and not by way of limitation, the buried P-region 609 may be formed through ion implantation. The P-type dopants are implanted at the bottom of the shield trench before the dielectric material 607 and shield electrode 611 are formed in the trench. The buried P-regions 609 below each trench may become connected to the adjacent buried P-regions 609. Additionally, the body region 606 nearest the active cell array 520 is connected to the body region 606 within the active cell array 520.

By way of example, and not by way of limitation, a semiconductor device having an active cell array and a termination region, may be formed as follows. An epitaxial layer of a first conductivity type may be formed on a top surface of a semiconductor substrate of the first conductivity type. The epitaxial layer includes a surface shielded region that is heavily doped positioned above a voltage blocking region that is lightly doped. A plurality of trenches is formed in the epitaxial layer. The plurality of trenches includes a first subset of trenches corresponding to a plurality of active cell devices in an active cell array and a second subset of trenches corresponding to a plurality of termination structures in a termination region surrounding the active cell array. Dopants of a second conductivity type opposite the first are implanted into bottoms of a subset of the trenches to form buried doped regions. E Each buried doped region is positioned below one of the plurality of trenches, and extends to a depth substantially the same as the bottom surface of the surface shielded region. Sidewalls of the trenches are then lined with an insulator, such as an oxide. Remaining portions of the trenches are filled with a conductive material to form trench shield electrodes. Dopants of the second conductivity type are implanted into the epitaxial layer to form body regions proximate the trenches. Dopants of the first conductivity type may be implanted into the body regions to form source regions proximate trenches corresponding to active devices in the active cell array. The termination region may be masked during this stage to prevent forming source regions in the termination structures.

Gate electrodes may be formed in the active cell array between adjacent trenches disposed near the top surface of the surface shielded region. Electrical connections may be formed to the shield electrodes of the termination structures. Each termination structure in a first zone closest to the active cell array includes an electrical connection between its trench shield electrode and a portion of the body layer closer to the active cell array. Each termination structure in a second zone includes an electrical connection between its trench shield electrode and a portion of the body layer further away from the active cell array. As noted above, a spacing between each termination structure in the second zone increases with increasing distance away from the active cell array.

Once the electric field has been spread it must then be brought back to the surface quickly and in a uniform manner. FIG. 5B shows that the electric field is allowed to move back to the surface by allowing the potential contours 530 to form in between the vertical walls of the shield electrodes 511.

Figure 6B:
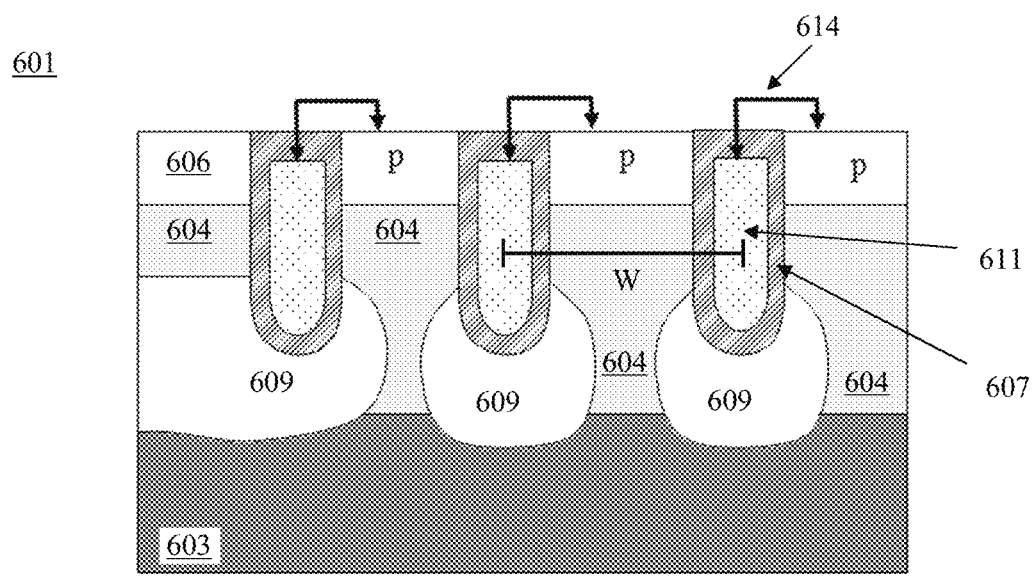

FIG. 6B depicts the termination structures 601 in the second termination zone 521*b*. The termination structures in the second zone 601 are formed in a similar manner to those in the first termination zone 521*a*. In the present embodiment there are only two differences. First, the shield electrode 611 is electrically connected to the body layer 606 immediately following the shield electrode 611. As shown in FIG. 6B, the body layer 606 immediately following the shield electrode 611 is the one immediately to the right of the trench and further away from the active area. Second, the spacing between the trenches W increases as the structures' 601 distance from the active cell array increases.

While the above is a complete description of the preferred embodiments of the present invention, it is possible to use various alternatives, modifications, and equivalents. Therefore, the scope of the present invention should be determined not with reference to the above description but should, instead, be determined with reference to the appended claims, along with their full scope of equivalents. The order of recitation of steps in a method is not intended to limit a claim to a particular order of performing the corresponding steps. Any feature, whether preferred or not, may be combined with any other feature, whether preferred or not. In the claims that follow, the indefinite article "A" or "An" refers to a quantity of one or more of the item following the article, except where expressly stated otherwise. The appended claims are not to be interpreted as including means-plus-function limitations, unless such a limitation is explicitly recited in a given claim using the phrase "means for". Any element in a claim that does not explicitly state "means for" performing a specified function, is not to be interpreted as a "means" or "step" clause as specified in 35 USC §112, 116.

What is claimed is:

1. A semiconductor device, comprising:
   a semiconductor substrate of a first conductivity type;
   an expitaxial layer of the first conductivity type disposed on a top surface of the semiconductor substrate, wherein the epitaxial layer includes a surface shielded region that is heavily doped positioned above a voltage blocking region that is lightly doped;
   an active cell array including a plurality of active semiconductor devices formed in the epitaxial layer; and
   a termination region surrounding the active cell array, wherein the termination region includes a plurality of termination structures formed in the epitaxial layer, each of the termination structures comprising a trench lined with a dielectric material and filled with a conductive material as a trench shield electrode, and a buried doped-region of the second conductivity type surrounding at least a bottom portion of the trench, and wherein the termination region includes a body region of second conductivity type opposite to the first conductivity type at a top surface of the surface shielded region proximate to the trench shield electrodes,
   wherein the plurality of termination structures has a first set of one or more termination structures closest to the active cell array, each termination structure in the first set including an electrical connection between its corresponding trench shield electrode and a first portion of the adjacent body layer closer to the active cell array.

2. The device of claim 1, wherein the plurality of termination structures has a second set of one or more termination structures adjacent to the first set, each termination structure in the second set including an electrical connection between its corresponding trench shield electrode and a second portion of the adjacent body layer further away from the active cell array.

3. The device of claim 1, wherein the buried doped-regions are connected to the body layer by a link region of the second conductivity type, wherein the link region is disposed along sidewalls of the trenches.

4. The device of claim 3, wherein the plurality of termination structures has a third set of one or more termination structures adjacent to an edge of a device die, wherein a floating electrode formed between two adjacent termination structures in the third set, the floating electrode being configured to create a disconnect between the body layer and the link region.

5. The device of claim 1, wherein a cumulative depth of the trench and the buried doped-region is substantially same as a depth of the surface shield region.

6. The device of claim 1, wherein each of the active semiconductor devices in the active cell array includes a field balance MOSFET (FBM) device structures.

7. The device of claim 1, wherein the epitaxial layer, the active semiconductor devices and the plurality of termination structures formed therein are configured such that the surface shielded region is sufficiently doped to support approximately one-third of the active semiconductor device's breakdown voltage and the voltage blocking region is sufficiently doped to support approximately two-thirds of the active semiconductor device's breakdown voltage.

* * * * *